United States Patent
Shive et al.

(10) Patent No.: US 8,153,538 B1
(45) Date of Patent: Apr. 10, 2012

(54) PROCESS FOR ANNEALING SEMICONDUCTOR WAFERS WITH FLAT DOPANT DEPTH PROFILES

(75) Inventors: Larry Wayne Shive, St. Charles, MO (US); Brian Lawrence Gilmore, Allen, TX (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 12/964,143

(22) Filed: Dec. 9, 2010

(51) Int. Cl.
  *H01L 21/26* (2006.01)
  *H01L 21/324* (2006.01)

(52) U.S. Cl. ........ 438/795; 438/571; 438/770; 438/776; 438/789; 438/799; 257/347; 257/682; 257/E21.328; 257/E21.285; 257/E21.639

(58) Field of Classification Search .................. 438/308, 438/455, 471–477, 502, 509, 522, 530, 540, 438/550, 660–664, 694, 795–799, 571, 770, 438/776, 787–792; 257/347, 682, E21.077, 257/E21.082, E21.333, E21.12, E21.324, 257/E21.454, E21.497, E33.075, E21.318–E21.321, 257/FOR. 407, FOR. 408, FOR. 242, FOR. 334
See application file for complete search history.

(56) References Cited

U.S. PATENT DOCUMENTS

| | | | |
|---|---|---|---|
| 6,670,261 B2 | 12/2003 | Akiyama et al. | |
| 6,818,569 B2 * | 11/2004 | Mun et al. | ...................... 438/799 |
| 6,841,450 B2 | 1/2005 | Kobayashi et al. | |
| 7,199,057 B2 | 4/2007 | Bae et al. | |
| 7,396,743 B2 | 7/2008 | Singh et al. | |
| 2005/0277272 A1 | 12/2005 | Singh et al. | |

FOREIGN PATENT DOCUMENTS

| | | |
|---|---|---|
| EP | 1189269 A1 | 3/2002 |
| EP | 1347508 A1 | 9/2003 |
| EP | 1548817 A1 | 6/2005 |
| JP | 05253447 | 10/1993 |
| JP | 10144697 A | 5/1998 |
| JP | 10144698 A | 5/1998 |
| JP | 2002100634 A | 4/2002 |
| JP | 2002217204 A | 8/2002 |
| JP | 2004095717 A | 3/2004 |
| JP | 2008-227060 * | 9/2008 |

* cited by examiner

*Primary Examiner* — Khiem D Nguyen
*Assistant Examiner* — Walter H Swanson
(74) *Attorney, Agent, or Firm* — Armstrong Teasdale LLP

(57) ABSTRACT

A process is disclosed for annealing a single crystal silicon wafer having a front surface and a back surface, and an oxide layer disposed on the front surface of the wafer extending over substantially all of the radial width. The process includes annealing the wafer in an annealing chamber having an atmosphere comprising oxygen. The process also includes maintaining a partial pressure of water above a predetermined value such that the wafer maintains the oxide layer through the annealing process. The annealed front surface is substantially free of boron and phosphorus.

16 Claims, 1 Drawing Sheet

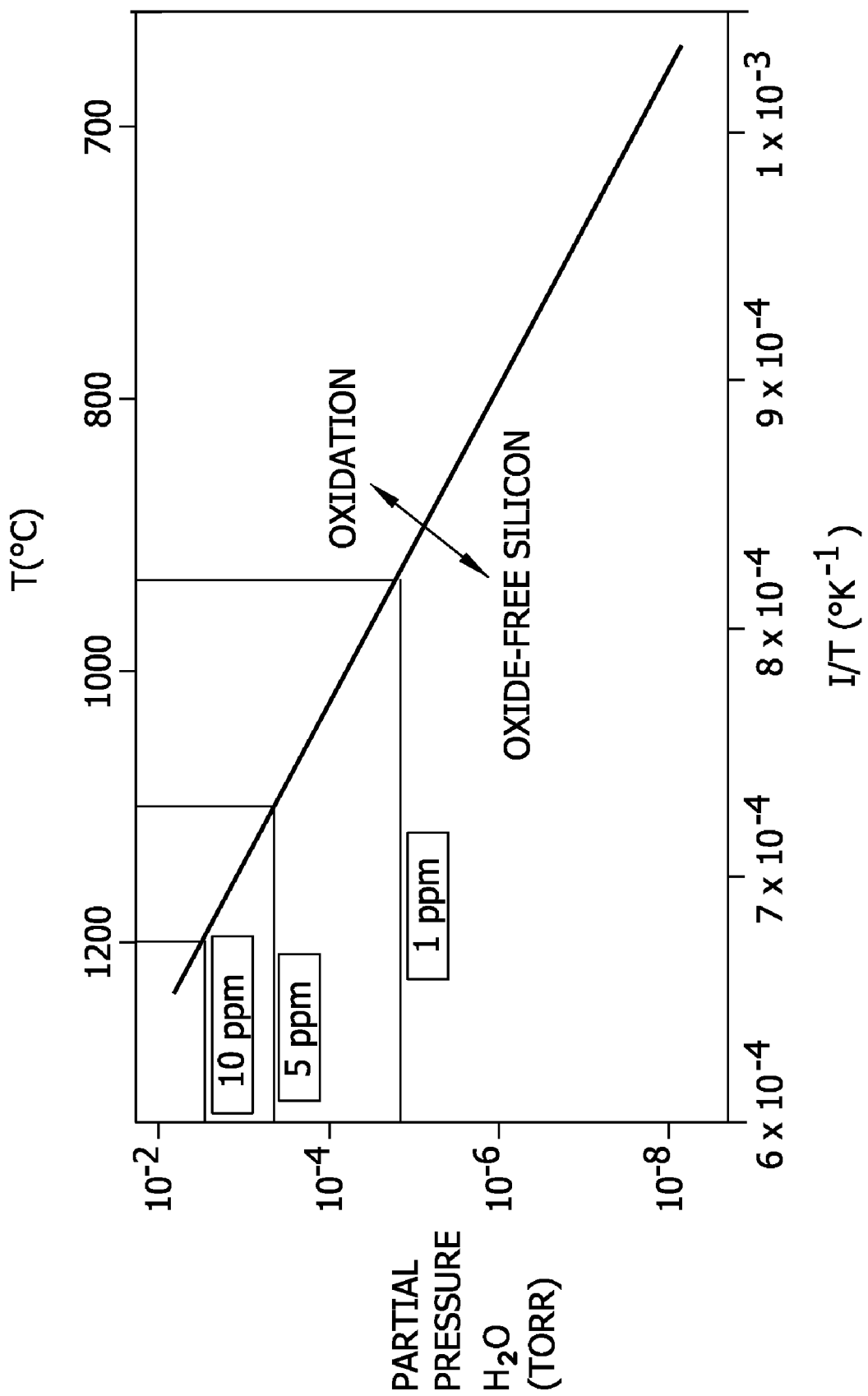

PROCESS FOR ANNEALING SEMICONDUCTOR WAFERS WITH FLAT DOPANT DEPTH PROFILES

FIELD

The field of the disclosure relates to semiconductor wafer processing, and more particularly, annealing of semiconductor wafers.

BACKGROUND

Semiconductor wafers, such as silicon wafers, often contain dopants. These dopants, such as boron and phosphorus, may contaminate the wafer. For example, if boron and phosphorus are present in the active device region of the wafer, unacceptable resistivity shifts may occur. Annealing can cause boron and phosphorus to be driven into the active device region in the top layer of the wafer. For purposes of this disclosure, the top layer of the wafer is the top 10 microns of the wafer. In some cases, the resistivity shift may even cause the wafer to shift from a P-type to an N-type wafer. Prior art solutions to this problem do not reliably or satisfactorily remove both boron and phosphorus contamination from the wafer.

BRIEF SUMMARY

In one aspect, a process is disclosed for annealing a single crystal silicon wafer having a front surface and a back surface, and an oxide layer disposed on the front surface of the wafer extending over substantially all of the radial width. The process includes annealing the wafer in an annealing chamber having an atmosphere comprising oxygen. The process also includes maintaining a partial pressure of water above a predetermined value such that the wafer maintains the oxide layer through the annealing process. The oxide layer has a maximum thickness of about 5 nanometers and a minimum thickness of about 0.5 nanometers so that the annealed front surface is substantially free of boron and phosphorus.

In another aspect, a process is disclosed for preparing a single crystal silicon wafer having a front surface and a back surface, and an oxide layer disposed on the front surface of the wafer extending over substantially all of the radial width. The process comprises annealing the wafer in an annealing chamber having an atmosphere comprising oxygen, hydrogen and an inert gas. The process also comprises maintaining a partial pressure of water above a predetermined value by controlling the amount of hydrogen and oxygen such that the wafer maintains the oxide layer through the annealing process and so that the annealed front surface is substantially free of boron and phosphorus.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

FIG. 1 is a graph illustrating the relationship between the partial pressure of water, temperature, oxygen and the oxide layer.

DETAILED DESCRIPTION OF THE DRAWINGS

In this embodiment, the wafer or wafers are single crystal silicon wafers which have been sliced from a single crystal ingot grown in accordance with conventional Czochralski crystal growing methods. Such methods, as well as standard silicon slicing, lapping, etching, and polishing techniques are disclosed, for example, in F. Shimura, Semiconductor Silicon Crystal Technology, Academic Press, 1989.

Each wafer typically contains one or more dopants to give the wafer various desired properties. Specifically, each wafer is typically a P-type wafer (i.e., a wafer that has been doped with an element from Group 3 of the Periodic Table such as boron, aluminum, gallium and indium, most typically boron). Note that other types of wafers are contemplated within the scope of this disclosure. This doping may be performed by adding dopant to the silicon melt prior to the crystal being pulled and the wafer being sliced therefrom. The wafer will typically have a resistivity greater than about 1 Ohm-cm, and in some embodiments a resistivity greater than 10 Ohm-cm. Each wafer will typically have a diameter of at least 200 mm, or at least 300 mm, or at least 400 mm or in some embodiments at least 450 mm.

Each wafer includes an oxide layer of predetermined thickness. In some embodiments, the oxide layer is about 6 to about 10 angstroms thick and formed chemically. A "clean" chemical oxide may be grown by using conventional methods, such as by using $H_2SO_4/H_2O_2$, SC1, SC2, ozone or $HF/H_2O_2$ as examples. In other embodiments, the oxide layer may be thermally grown and be less than about 10 angstroms thick.

During standard annealing of multiple wafers in a batch process, an oxide layer on each wafer will evaporate more quickly from the wafer edge than from the wafer center. During evaporation, contaminants can diffuse into the wafer at the wafer edge, while contaminants at the wafer center are not diffused but rather evaporated with the oxide layer at the center. This problem is increased with increasing wafer pitch. Note that the annealing process may be a single wafer or a batch/multiple wafer process.

FIG. 1 illustrates the relationship between the partial pressure of water, temperature, oxygen and the oxide layer. In the graph of FIG. 1, the Y-axis is partial pressure $P_o$ (in Torr), the upper X-axis is temperature in degrees Celsius and the lower X-axis is temperature in degrees Kelvin. An oxidation line extends diagonally from the upper left of the graph to the lower right of the graph and indicates whether the oxide layer will remain on the wafer. Certain oxygen content amounts (1 ppm, 5 ppm and 10 ppm) are also plotted on the graph. At conditions above the oxidation line, the oxide layer is maintained on the wafer. At conditions below the line, the oxide layer is removed so that the wafer is oxide free. The graph can be used to obtain the critical or predetermined value of partial pressure $P_o$ in order to maintain the oxide layer on the wafer.

According to one embodiment of this disclosure, the wafer is suitably annealed in an annealing chamber of a conventional annealing furnace such as an A412 vertical furnace available from ASM America, Inc. A suitable process for annealing the wafer comprises a first anneal and a second anneal. The first anneal comprises inserting the wafer in a pre-heated annealing chamber. Note that the wafer may have a pitch during the annealing step, such as a pitch of at least 5 mm, or at least about 7 mm, or even at least about 10 mm.

The chamber is suitably pre-heated to a temperature between about 400 and about 750° C., for example to about 450° C. The temperature is allowed to stabilize for 10-30 minutes after the wafer is inserted, and is thereafter increased to between about 585 and about 1050° C. The temperature ramp rate may be between 1 and 15 degrees/minute, and typically the rate is lower at higher temperatures. In one embodiment, the temperature is increased to about 1000° C. and held steady at that temperature during the first anneal. The first anneal may be performed for a time period of at least about 10 minutes, at least about 20 minutes, between about 20-40 minutes, or in an example embodiment, for about 30 minutes.

Without being held to any particular theory, it is believed that in a mostly argon atmosphere, the oxide layer on the wafer will be completely removed at a temperature greater than about 1050° C. Hydrogen and oxygen do not spontaneously react to form water below about 585° C. Accordingly, the annealing temperature is suitably between about 585 and 1050° C., between about 800 and 1050° C., between about 900 and about 1050° C., or in one example embodiment, about 1000° C.

When the wafer is inserted in the chamber, the atmosphere initially comprises only an inert gas, such as 100% argon or helium. During ramp-up, hydrogen is introduced into the atmosphere to control the water partial pressure and to thereby maintain the oxide layer. Oxygen is also introduced into the atmosphere to control the water partial pressure and to thereby maintain the oxide layer. In one embodiment, hydrogen is introduced when the temperature reaches about 600° C., and oxygen is introduced when the temperature reaches about 800° C. The hydrogen and oxygen flow into the chamber during the entire time period of the first anneal.

The amount of hydrogen and oxygen are sufficient to maintain the oxide layer thickness, but not to grow a thicker oxide layer. The graph of FIG. 1 may be used to obtain the critical or predetermined value of partial pressure $P_o$ in order to maintain the oxide layer on the wafer. From that value, the appropriate amount of hydrogen and oxygen can be determined. Hydrogen may be used in excess but the oxygen content must be sufficient to form the amount of water vapor indicated.

In one embodiment, sufficient hydrogen is introduced so that the atmosphere is at least about 0.5% hydrogen, or at least about 1% or in one example, about 3% hydrogen. Oxygen is introduced in sufficient amount so that there is at least about 1 ppm, or about 1 to 5 ppm, or about 5 ppm of oxygen in the annealing chamber atmosphere. In one example, the total gas flow rate into the reactor is about 20 standard liters per minute, and the oxygen flow rate is about 0.1 ml/minute, to achieve oxygen content of 5 ppm of oxygen as water in the chamber atmosphere.

After the first anneal is complete, the temperature may be ramped up for the second anneal. In one embodiment, the temperature may be ramped up at a rate as high as 15 degrees per minute, but more typically at a rate less than 10 degrees per minute, or at a rate as low as about 1 degree per minute. During the ramp-up to the second anneal, flow of hydrogen and oxygen are stopped so that during the second anneal, the atmosphere is about 100% inert gas. For the second anneal, the temperature reaches a temperature of greater than about 1050° C., for example, between about 1150 and 1250° C., or in another example about 1200° C. or greater. Suitably, the second anneal time period is at least about a half hour, or about one hour. This second anneal is typically performed in the same chamber as the first anneal, but may alternatively be performed in a separate chamber.

After the second anneal, the temperature is ramped down at a rate approximately equal to or less than the ramp-up rate. The ramp-down continues until the furnace reaches a temperature in the range of about 300-500° C., e.g., about 450° C. The chamber atmosphere during the ramp-down is suitably about 100% inert gas, such as argon.

Control of the partial pressure results in control of the thickness of the oxide layer. In one embodiment, the wafer maintains the oxide layer through the first annealing such that the oxide layer has a maximum thickness of about 5 nanometers and a minimum thickness of about 0.5 nanometers so that the annealed front surface is substantially free of boron and phosphorus. In another embodiment, the wafer maintains the oxide layer through the first annealing such that the oxide layer has a maximum thickness and a minimum thickness that differ by no more than 100%. This results in the front surface of the wafer being substantially free of boron and phosphorus after annealing.

The tolerance for the first anneal may be about +/−25° C. or in some embodiments less than +/−5° C. Time at the first anneal temperature will depend upon the amount of surface dopant concentration that must be removed, but will typically not be less than 5 minutes and not more than 1 hour. Temperature of the first anneal may be at least 900° C. and not more than 1075° C. The hydrogen content of the first anneal may be greater than 50 ppm and may even be greater than 99%. Oxygen content will exceed the amount shown in FIG. 1 to sustain the silicon oxide layer but should be controlled so that the oxide grown during the $1^{st}$ anneal step does not exceed 50 angstroms, or in some embodiments, does not exceed even 20 angstroms.

Each wafer produced by this annealing process is substantially free of boron and phosphorus in the active device region (the electrically active layer) in the top layer of the wafer. The wafer also has a flat doping profile in the top layer of the wafer. As described above, the amount of oxygen and hydrogen is carefully controlled to maintain water in the annealing furnace atmosphere slightly above a partial pressure that enables the oxide layer on the wafer to be maintained, but without substantial growth of the oxide layer until the first annealing step is completed and all the boron and phosphorus have been removed from the surface. The second, higher temperature step uses no oxygen or water and will completely remove this oxide layer, leaving a smooth, oxide-free silicon surface.

Example

One example of the annealing process will now be described. Note that this is merely one example, and many other examples are contemplated within the scope of this disclosure. The wafer is inserted into the annealing furnace at a furnace insertion temperature of about 450° C. The furnace atmosphere is 100% Argon when the wafer is inserted. The temperature of the furnace is increased (during ramp-up) to about 600° C. at a ramp rate of 10° C./min. Hydrogen is introduced to the chamber during ramp-up so that the atmosphere inside the furnace is 97% Argon and 3% Hydrogen. The temperature continues to increase, and when the temperature reaches 800° C., oxygen is maintained in the furnace atmosphere at about 5 ppm. The temperature is increased to about 1000° C., and the temperature is then held during a first anneal or hold period at about 1000° C. for a period of about 30 minutes. At this first anneal, oxygen is maintained at about 5 ppm, and the partial pressure is about 0.002 Torr.

After the first anneal is complete, the temperature is increased further. As the temperature increases, oxygen flow is turned off at about 1025° C., and then hydrogen flow is turned off at about 1050° C. The temperature continues to increase until it reaches about 1200° C., whereat the temperature is held for about 60 minutes in a second hold period or anneal. No hydrogen or oxygen is introduced during the 2nd anneal so that the atmosphere is about 100% Argon. After the second anneal is complete, temperature is ramped down to about 450° C. over a time period of about 300 minutes.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above apparatus and methods without departing from the scope of the disclosure, it is intended that all matter contained in the above description and shown in the accompanying figures shall be interpreted as illustrative and not in a limiting sense.

What is claimed is:

1. A process for annealing a single crystal silicon wafer having a front surface and a back surface, and an oxide layer disposed on the front surface of the wafer extending over substantially all of a radial width, the process comprising:
    annealing the wafer in an annealing chamber having an atmosphere comprising oxygen; and
    maintaining a partial pressure of water above a predetermined value such that the wafer maintains the oxide layer through the annealing, the oxide layer having a maximum thickness of about 5 nanometers and a minimum thickness of about 0.5 nanometers so that the annealed front surface is substantially free of boron and phosphorus.

2. The process of claim 1 wherein the atmosphere further comprises hydrogen and an inert gas.

3. The process of claim 2 wherein the atmosphere comprises at least about 0.5% hydrogen.

4. The process of claim 2 wherein the inert gas is argon.

5. The process of claim 1 wherein the atmosphere comprises from about 1 ppm to about 5 ppm of oxygen.

6. The process of claim 1 wherein the silicon wafer is annealed at a temperature between about 900° C. and about 1050° C.

7. The process of claim 1 wherein the silicon wafer is annealed at a temperature of about 1000° C.

8. The process of claim 1 wherein the silicon wafer is annealed for a time of at least about 10 minutes.

9. The process of claim 1 wherein the silicon wafer is annealed for a time of about 30 minutes.

10. The process of claim 1 further comprising a second anneal separate from a first-referenced anneal in an atmosphere consisting essentially of inert gas.

11. The process of claim 10 wherein the second anneal is performed at a temperature between about 1150° C. and 1250° C.

12. The process of claim 11 wherein the temperature is held at 1200° C. for 1 hour.

13. The process of claim 12 wherein the temperature is ramped down to 450° C.

14. The process of claim 1 wherein a gas flow rate in the annealing chamber is about 20 standard liters per minute.

15. The process of claim 1 wherein the wafer is a P-type wafer.

16. The process of claim 1 wherein the wafer is at least 400 mm in diameter.

* * * * *